(12) United States Patent
Kamei et al.

(10) Patent No.: US 7,050,332 B2
(45) Date of Patent: May 23, 2006

(54) NONVOLATILE REGISTER AND SEMICONDUCTOR DEVICE

(75) Inventors: Teruhiko Kamei, Yokohama (JP); Masahiro Kanai, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 254 days.

(21) Appl. No.: 10/373,166

(22) Filed: Feb. 26, 2003

(65) Prior Publication Data
US 2003/0174558 A1 Sep. 18, 2003

(30) Foreign Application Priority Data
Mar. 14, 2002 (JP) .............................. 2002-070148

(51) Int. Cl.
*G11C 16/04* (2006.01)
(52) U.S. Cl. .............................................. 365/185.28
(58) Field of Classification Search ........... 365/185.28, 365/185.23, 185.25
See application file for complete search history.

(56) References Cited

U.S. PATENT DOCUMENTS

| | | | |
|---|---|---|---|
| 5,408,115 A | 4/1995 | Chang | |
| 5,422,504 A | 6/1995 | Chang et al. | |
| 5,494,838 A | 2/1996 | Chang et al. | |
| 5,969,383 A | 10/1999 | Chang et al. | |
| 6,067,598 A * | 5/2000 | Roohparvar et al. | 365/185.33 |
| 6,104,634 A * | 8/2000 | Rochard | 365/185.05 |
| 6,177,318 B1 | 1/2001 | Ogura et al. | |
| 6,248,633 B1 | 6/2001 | Ogura et al. | |
| 6,255,166 B1 | 7/2001 | Ogura et al. | |
| 6,304,497 B1 * | 10/2001 | Roohparvar | 365/189.04 |
| 6,735,121 B1 * | 5/2004 | Yoshida | 365/185.22 |
| 6,807,105 B1 * | 10/2004 | Ogura et al. | 365/185.28 |
| 6,809,385 B1 * | 10/2004 | Ebina et al. | 257/365 |

FOREIGN PATENT DOCUMENTS

| | | |
|---|---|---|
| JP | A 7-161851 | 6/1995 |
| JP | B1 2978477 | 9/1999 |
| JP | A 2001-156188 | 6/2001 |

OTHER PUBLICATIONS

U.S. Appl. No. 09/955,158, filed Sep. 19, 2001, Kanai et al.
U.S. Appl. No. 09/955,160, filed Sep. 19, 2001, Kanai et al.
U.S. Appl. No. 10/115,913, filed Apr. 5, 2002, Kamei.
U.S. Appl. No. 10/115,956, filed Apr. 5, 2002, Kamei.
U.S. Appl. No. 10/153,611, filed May 24, 2002, Owa.

(Continued)

*Primary Examiner*—Thong Q. Le
(74) *Attorney, Agent, or Firm*—Oliff & Berridge, PLC (57) ABSTRACT

A nonvolatile register includes at least one memory cell. The memory cell has one word gate and first and second nonvolatile memory elements controlled by first and second control gates, respectively. Data is stored in one of the first and second nonvolatile memory elements, and the other of the first and second nonvolatile memory elements does not function as an element which stores data.

15 Claims, 8 Drawing Sheets

OTHER PUBLICATIONS

U.S. Appl. No. 10/153,686, filed May 24, 2002, Owa.
U.S. Appl. No. 10/153,736, filed May 24, 2002, Owa.
U.S. Appl. No. 10/157,896, filed May 31, 2002, Kamei et al.
U.S. Appl. No. 10/157,897, filed May 31, 2002, Kamei et al.
U.S. Appl. No. 10/193,066, filed Jul. 12, 2002, Kanai.
U.S. Appl. No. 10/193,602, filed Jul. 12, 2002, Kanai.
U.S. Appl. No. 10/197,643, filed Jul. 18, 2002, Kanai et al.
U.S. Appl. No. 10/197,644, filed Jul. 18, 2002, Kamei.
U.S. Appl. No. 10/197,645, filed Jul. 18, 2002, Natori.
U.S. Appl. No. 10/197,646, filed Jul. 18, 2002, Kanai.
U.S. Appl. No. 10/197,668, filed Jul. 18, 2002, Kanai.
U.S. Appl. No. 10/229,064, filed Aug. 28, 2002, Kamei.
U.S. Appl. No. 10/246,486, filed Sep. 19, 2002, Natori.
U.S. Appl. No. 10/246,665, filed Sep. 19, 2002, Natori.
U.S. Appl. No. 10/246,708, filed Sep. 19, 2002, Natori.
U.S. Appl. No. 10/246,727, filed Sep. 19, 2002, Natori.
U.S. Appl. No. 10/323,921, filed Dec. 20, 2002, Natori.
U.S. Appl. No. 10/356,644, filed Feb. 3, 2003, Kamei et al.
U.S. Appl. No. 10/361,573, filed Feb. 11, 2003, Kamei et al.
U.S. Appl. No. 10/377,707, filed Mar. 15, 2002, Kamei et al.
U.S. Appl. No. 10/377,699, filed Mar. 4, 2003, Kamei et al.
U.S. Appl. No. 10/385,506, filed Mar. 12, 2003, Kamei et al.
U.S. Appl. No. 10/385,661, filed Mar. 12, 2003, Kamei et al.
Hayashi et al., "Twin MONOS Cell with Dual Control Gates", 2000 IEEE VLSI Technology Digest of Technical Papers.
Chang et al., "A New SONOS Memory Using Source-Side Injection for Programming", IEEE Electron Device Letters, vol. 19, No. 7, Jul. 1998, pp. 253-255.
Chen et al., "A Novel Flash Memory Device with S Plit Gate Source Side Injection and ONO Charge Storage Stack (SPIN)", 1997, VLSI Technology Digest, pp. 63-64.

* cited by examiner

NONVOLATILE REGISTER AND SEMICONDUCTOR DEVICE

Japanese Patent Application No. 2002-70148 filed on Mar. 14, 2002, is hereby incorporated by reference in its entirety.

BACKGROUND OF THE INVENTION

The present invention relates to a nonvolatile register which stores specific information, and a semiconductor device.

A nonvolatile register, Content Addressable Memory (CAM) cell, for example, is formed in a certain type of semiconductor memory device. Various types of information such as an address for specifying a defective sector region of a memory cell array can be stored in the nonvolatile register, for example.

BRIEF SUMMARY OF THE INVENTION

The present invention may provide a novel nonvolatile register and a semiconductor device.

A nonvolatile register according to one aspect of the present invention includes: at least one memory cell, wherein the memory cell includes one word gate, and first and second nonvolatile memory elements controlled by first and second control gates, respectively. Data may be stored in one of the first and second nonvolatile memory elements, and the other of the first and second nonvolatile memory elements may not function as an element which stores data.

According to this aspect of the present invention, voltage applied to the control gate of the nonvolatile memory element in which data is not stored (element which does not function as a memory element which stores data and into which information is not written at the time of programming) in a data read mode is not necessarily an override voltage which is generated by boosting a power supply voltage. In other words, since it suffices that the applied voltage be a voltage higher than a threshold voltage in a state in which charges are not trapped in the memory element, the applied voltage may be a voltage appreciably lower than the override voltage. Therefore, it is unnecessary to apply a boosted voltage to the control gate in the data read mode. As a result, according to the nonvolatile register of the present invention, data can be easily read at the time of turning the power on.

One of the first and second nonvolatile memory elements of one memory cell may be designated as a selected cell and the other may be designated as a nonselected opposite cell at the time of reading data, and a voltage equal to or lower than a power supply voltage may be supplied to both the selected cell and the nonselected opposite cell. In this case, a select voltage may be applied to the control gates of both the selected cell and the non-selected cell.

The nonvolatile register may further include a driver circuit which generates a drive voltage for driving the word gate and the first and second control gates, and the driver circuit may generate the drive voltage based on a power supply voltage.

According to this feature, since the drive voltage is generated based on the power supply voltage, a charge pump is unnecessary for the data read operation.

In this aspect of the present invention, each of a plurality of bit lines may be connected in common with the adjacent first and second nonvolatile memory elements in two memory cells adjacent in a row direction in each row and may extend in a column direction. In this case, the adjacent first and second nonvolatile memory elements of the two memory cells share a single bit line.

The same data may be stored in the first nonvolatile memory element in one of the two adjacent memory cells and the second nonvolatile memory element in the other of the two adjacent memory cells. This enables the amount of current flowing through the bit line at the time of reading data to be increased. Each of the bit lines is fixed on either a source side or a drain side. The bit line connected in common with the two adjacent memory cells may function as a drain line.

A plurality of dummy memory cells may be provided around the nonvolatile register, and each of the dummy memory cells may include the word gate and at least one of the first and second nonvolatile memory elements of the memory cell.

This enables process conditions between the center region and the end region of the nonvolatile register to be made-uniform, thereby preventing formation of a defective memory cell. As a result, yield can be improved.

Each of the first and second nonvolatile memory elements may include an ONO film formed of an oxide film (O), a nitride film (N), and an oxide film (O) as a charge trap site. However, another trap structure may be employed.

A semiconductor device according to another aspect of the present invention includes:

the above nonvolatile register, a data holding circuit for holding data read from the nonvolatile register, and a judging circuit for judging whether or not the data read from the data holding circuit coincides with a signal to be judged.

A switching element may be provided between the nonvolatile register and the data holding circuit, and connection or disconnection between the nonvolatile register and the data holding circuit may be selected by the switching element.

According to this feature, it is unnecessary to drive the nonvolatile register after data is once read from the nonvolatile register to the data holding circuit. As a result, power consumption can be reduced.

The semiconductor device may include a memory cell array region having a plurality of sector regions and a redundant sector region, and address information of one of the sector regions to be switched to the redundant sector region may be stored in the nonvolatile register.

This eliminates the need to cut a fuse by using a laser when replacing a defective sector region with the redundant sector region in a repair step, whereby a period of time required for the repair step can be reduced.

The memory cell array region may be formed of the same memory cell as the memory cell of the nonvolatile register. This enables the memory cell array and the nonvolatile register to be formed in the same step, whereby the number of manufacturing steps can be decreased.

The semiconductor device may further include a voltage generating circuit which generates a drive voltage for driving the memory cell array, and the voltage generating circuit may be used as a circuit which generates a voltage supplied to the nonvolatile register.

In this case, since it is unnecessary to separately form a circuit which generates a voltage supplied to the nonvolatile register, the size of the chip can be decreased.

A semiconductor device according to a further aspect of the present invention includes the above nonvolatile register, and a judging circuit for judging whether or not data read from the nonvolatile register coincides with a signal to be judged.

DETAILED DESCRIPTION OF THE EMBODIMENT

Embodiments of the present invention are described below with reference to the drawings.

Nonvolatile Register

Configuration of Nonvolatile Register

Figure 1:
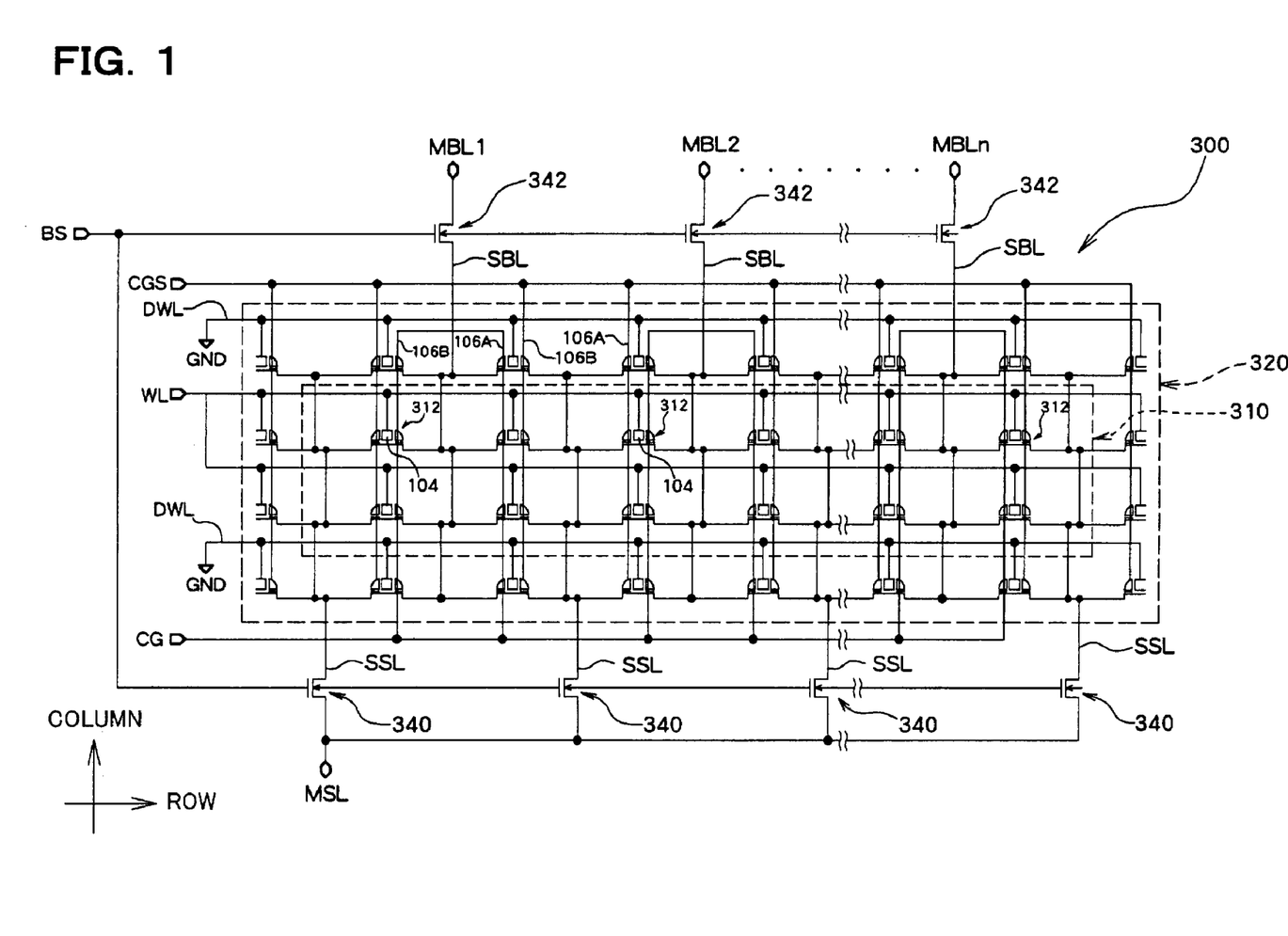
FIG. 1 is a circuit diagram showing an example of a nonvolatile register.

FIG. 1 is a circuit diagram showing an example of a nonvolatile register.

A nonvolatile register 300 has a memory cell group 310. A plurality of memory cells 312 are formed in the memory cell group 310.

Figure 2:
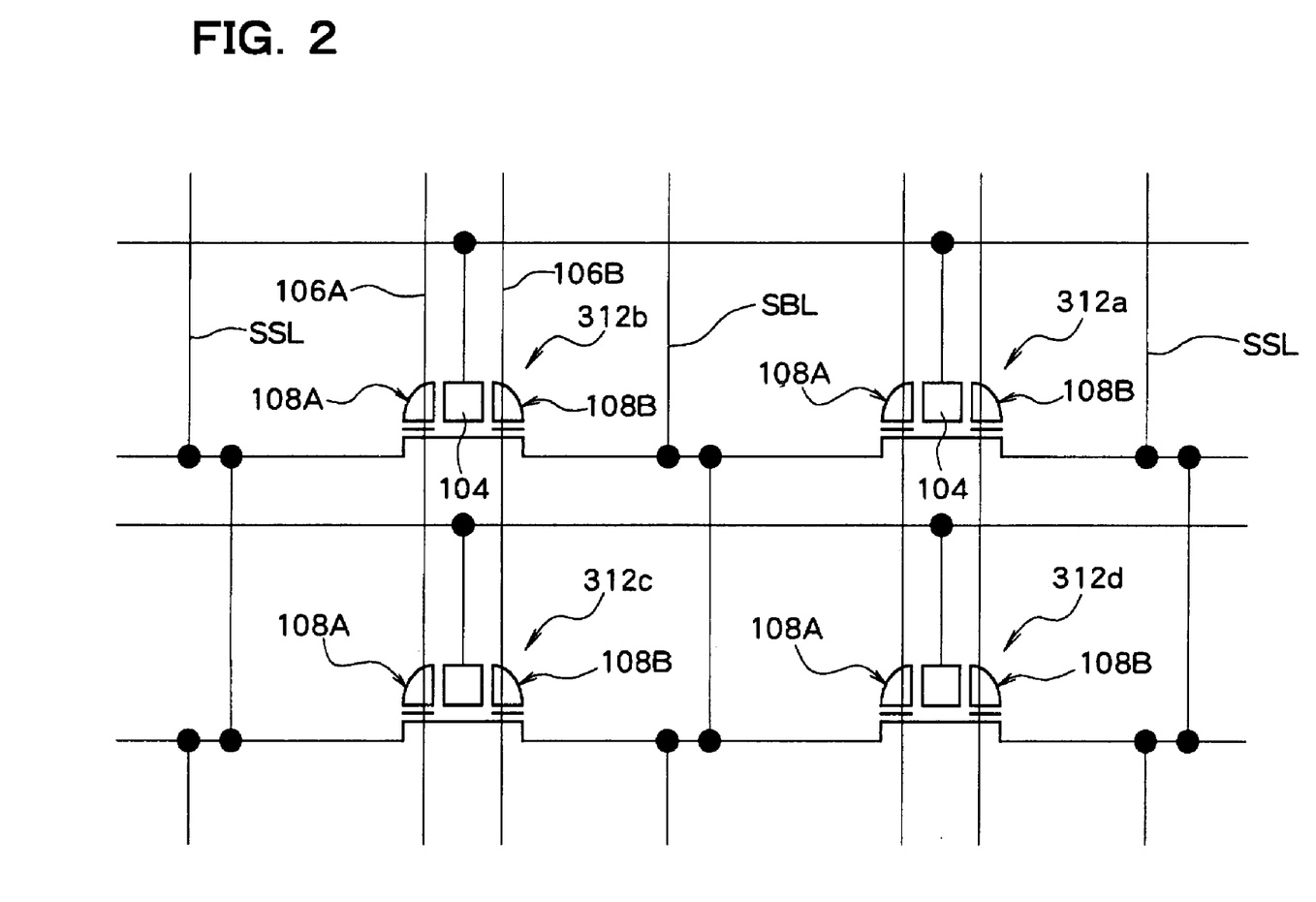
FIG. 2 is an enlarged circuit diagram showing memory cells shown in FIG. 1.

FIG. 2 is an enlarged circuit diagram showing the memory cells shown in FIG. 1.

As shown in FIG. 2, each of the memory cells 312a, 312b, 312c, and 312d includes a word gate 104, first and second control gates 106A and 106B, and first and second nonvolatile memory elements (MONOS memory elements) 108A and 108B.

The nonvolatile register is described below taking a case where data is stored in one of the first and second nonvolatile memory elements 108A and 108B and data is not written in the other nonvolatile memory element as an example.

As shown in FIG. 1, a plurality of sub source lines SSL and a plurality of sub bit lines SBL are provided along the column direction between the memory cells 312. The sub source lines SSL and the sub bit lines SBL are alternately arranged in the row direction. Each of a plurality of the sub bit lines SBL is connected in common with the adjacent first and second nonvolatile memory elements 108A and 108B of two memory cells 312 in each row adjacent in the row direction. Each of a plurality of the sub source lines SSL is connected in common with the adjacent first and second nonvolatile memory elements 108A and 108B of two memory cells 312 in each row adjacent in the row direction.

The same data is stored in the first nonvolatile memory element 108A of one of the two memory cells 312 connected with a single sub bit line SBL and the second nonvolatile memory element 108B of the other memory cell 312. Taking a reverse mode as an example, the same data is stored in the first nonvolatile memory element 108A of the first memory cell 312a and the second nonvolatile memory element 108B of the second memory cell 312b, as shown in FIG. 2.

As shown in FIG. 1, a plurality of the sub source lines SSL are connected/disconnected with a main source line MSL by allowing switching elements 340 to be turned on/off by a select signal line BS. The main source line MSL is grounded. A plurality of the sub bit lines (drain lines) SBL are connected/disconnected with corresponding main bit lines MBL1, MBL2, . . . , and MBLn by allowing switching elements 342 to be turned on/off by the select signal line BS.

Two control gates 106A and 106B adjacent to each other across the sub bit line SBL are connected in common with a main control gate CG. Two control gates 106A and 106B adjacent to each other across the sub source line SSL are connected in common with a main control gate CGS.

As shown in FIG. 1, a plurality of the word gates 104 arranged at intervals in the row direction are connected in common with one word line WL formed of a polycide or the like.

A dummy memory cell group 320 is provided around the memory cell group 310. This enables process conditions between the center region and the end region of the memory cell group 310 to be made uniform when forming the nonvolatile register. This prevents formation of a defective nonvolatile register, whereby the yield can be improved. Word lines DWL of the dummy memory cell group 320 provided around the memory cell group 310 in the column direction are grounded. A dummy memory cell includes at least one word gate 104 and one of the first and second nonvolatile memory elements 108A and 108B of the memory cell 312.

Structure of Memory Cell

Figure 3:
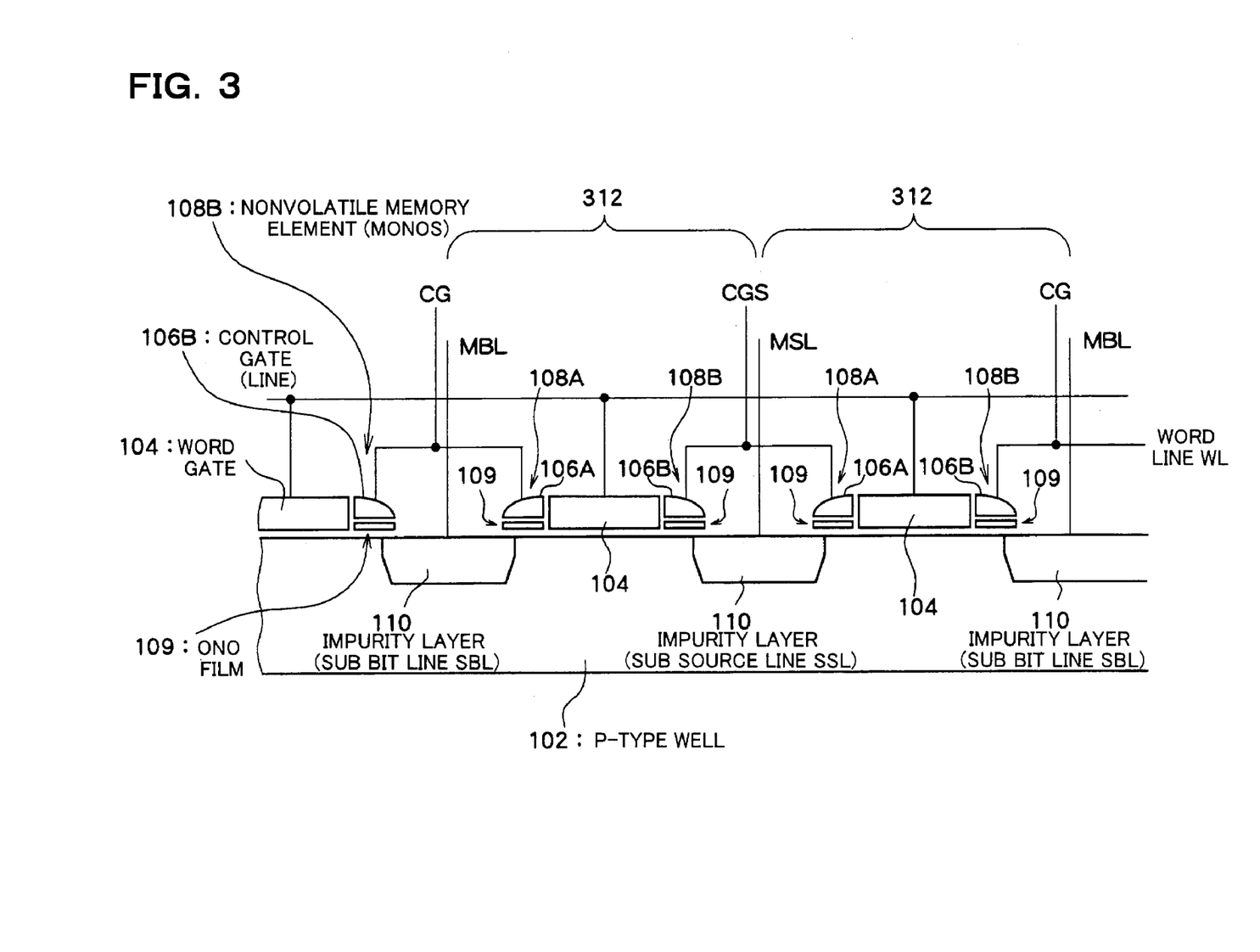
FIG. 3 is a cross-sectional view showing memory cells used in the nonvolatile register.

FIG. 3 is a cross-sectional view of the memory cells of the nonvolatile register.

The word gate 104 is formed of a material containing polysilicon on a P-type well 102 through a gate oxide film, for example. The first and second control gates 106A and 106B are formed on opposite sidewalls of the word gate 104. The first and second control gates 106A and 106B are electrically insulated from the word gate 104. Each of the first and second nonvolatile memory elements 108A and 108B is formed by layering an oxide film (O), a nitride film (N), and an oxide film (O) between one of the first and second control gates 106A and 106B formed of polysilicon corresponding to M (Metal) in MONOS and the P-type well 102. The first and second control gates 106A and 106B may be formed of a conductive material such as a silicide.

As described above, one memory cell 100 includes the first and second nonvolatile memory elements 108A and 108B, each having a split gate (first and second control gates 106A and 106B). One word gate 104 is shared by the first and second nonvolatile memory elements 108A and 108B.

Each of the first and second nonvolatile memory elements 108A and 108B is capable of trapping charges in the ONO film 109.

A plurality of the sub bit lines SBL and a plurality of the sub source lines SSL are formed of impurity layers 110 provided in the P-type well 102.

Operation of Memory Cell

Reading of data from the nonvolatile register of the present embodiment is described below. An example in which data is stored in only one of the nonvolatile memory elements of the memory cell and the other nonvolatile memory element does not function as an element which stores data is described below.

Selected cells of the nonvolatile register consist of the nonvolatile memory element (selected cell) 108A or 108B on a selected side and the nonvolatile memory element (nonselected opposite cell) 108A or 108B on an opposite side. In more detail, data is stored in the nonvolatile memory element on the selected side, and the nonvolatile memory element on the opposite side does not function as an element which stores data.

The potentials of the control gate line CG, the bit line BL, and the word line WL when reading data are shown in Table 1 based on the above definitions.

TABLE 1

| | | Selected block | | | | |
| | | | Selected MONOS cell | | | |
| | | | Selected cell | | Opposite cell | |
| Mode | BS | WL | SL | CG | BL | CG |
| Read | Vdd | Vdd | 0 V | 1.5 V or Vdd | Output | 1.5 V or Vdd |

As shown in Table 1, the voltage of the control gate of the nonselected opposite cell may be a select voltage. Specifically, the voltage of the control gate of the selected cell may be the same as the voltage of the control gate of the nonselected opposite cell.

Taking the potentials shown in Table 1 into consideration, a drive voltage of the word gate and the control gate may be generated by a driver circuit as a voltage equal to or lower than a power supply voltage based on the power supply voltage. This eliminates the need for a charge pump.

Effects of the nonvolatile register according to the embodiment are described below.

(1) The following effects are obtained by allowing data to be stored in one of the nonvolatile memory elements of the memory cell 312, and the other nonvolatile memory element not to function as an element which stores data.

Figure 8:
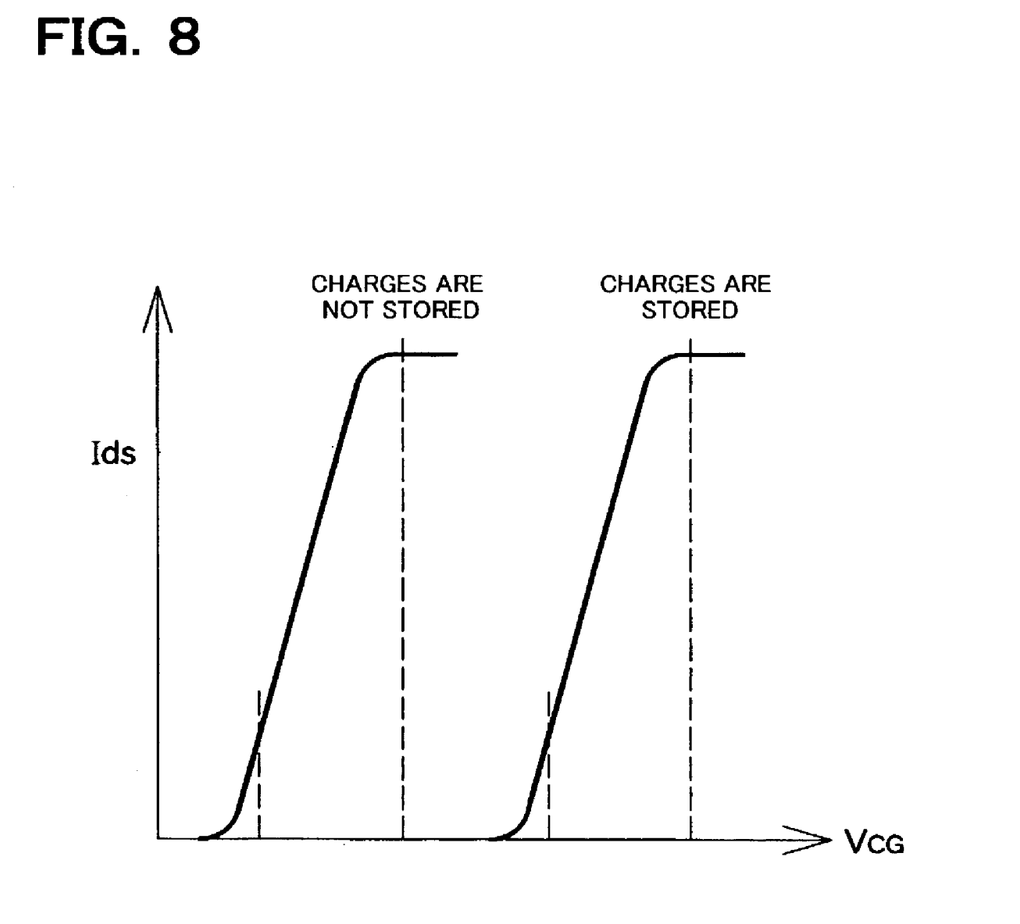
FIG. 8 is a graph for describing effects of the nonvolatile register.

In the case of reading data from the nonvolatile memory element on the selected side, voltage must be applied to the control gate of the nonvolatile memory element on the opposite side (nonselected opposite cell). As shown in FIG. 8, in the case where data is not stored in the nonselected opposite cell (charges are not present), the voltage applied to the nonselected opposite cell may be lower than in the case where data is stored (charges are present). In other words, the voltage applied to the nonselected opposite cell may be a voltage higher than a threshold voltage in a state in which charges are not present in the cell such as the select voltage, as shown in Table 1. In the case where the threshold voltage is equal to or lower than the power supply voltage, the voltage applied to the control gate of the opposite cell may be the power supply voltage Vdd, as shown in Table 1. As a result, it is unnecessary to generate a voltage boosted by using a charge pump when applying voltage to the control gate of the memory element on the opposite side at the time of reading. Therefore, a boosted voltage is unnecessary for driving the memory cell when reading data from the selected memory element. Therefore, according to the nonvolatile register of the present embodiment, data can be easily read from the nonvolatile register when turning the power on.

Moreover, in the case where data is stored in one of the memory elements and is not stored in the other memory element, an erase program is simplified.

(2) Since a plurality of the memory elements in which the same data is stored are connected with a single sub bit line, a necessary current flowing through a latch circuit can be secured reliably.

Semiconductor Device

Configuration of Semiconductor Device

Figure 4:
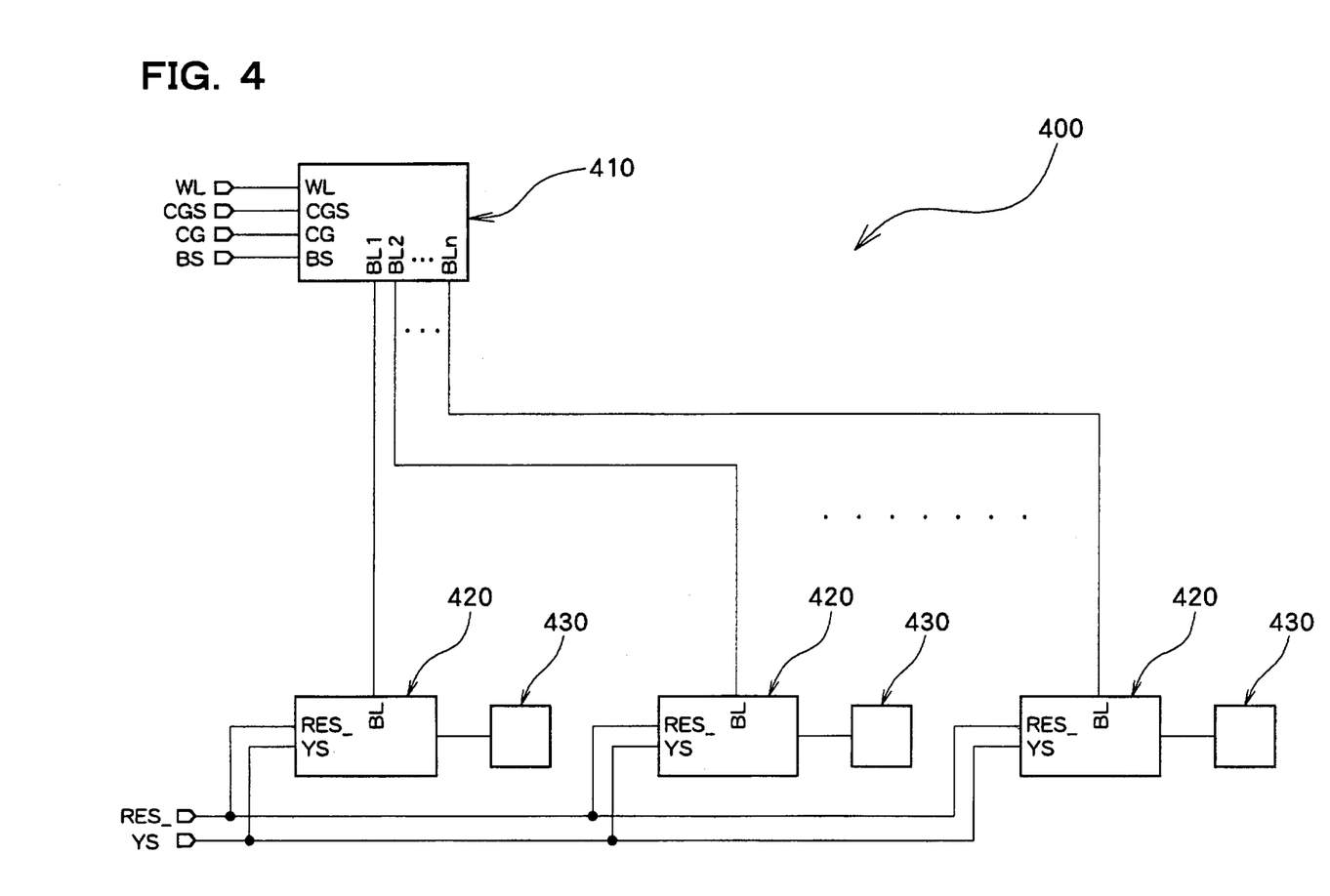
FIG. 4 is a block diagram showing a configuration of a semiconductor device.

FIG. 4 is a block diagram showing a configuration of a semiconductor device.

A semiconductor device 400 includes a nonvolatile register 410 according to the present invention, a data holding circuit 420, and a judging circuit 430. The data holding circuit 420 and the judging circuit 430 are provided for each bit of the nonvolatile register 410. In other words, a pair made up of the data holding circuit 420 and the judging circuit 430 is present for the number of bits of the nonvolatile registers 410.

The nonvolatile register 410 according to the present invention may be formed by the nonvolatile register according to the above embodiment.

Figure 5:
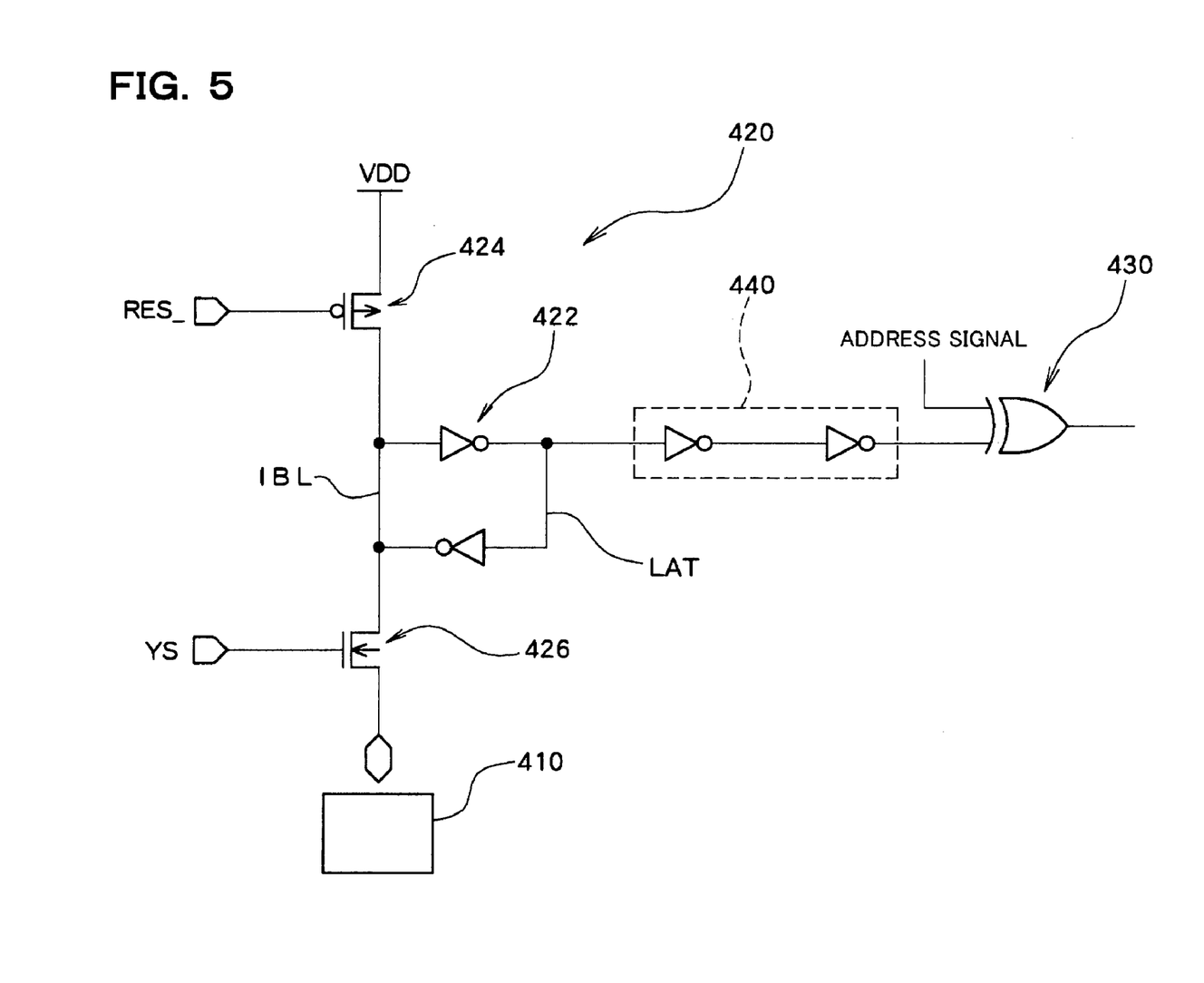
FIG. 5 is a circuit diagram showing a specific configuration of a data holding circuit and a judging circuit.

FIG. 5 is a circuit diagram showing a specific configuration of the data holding circuit 420 and the judging circuit 430. The judging circuit 430 may be formed of an exclusive OR circuit. The data holding circuit 420 includes a latch circuit 422. Since the nonvolatile register 410 includes the data holding circuit 420, in particular, the latch circuit 422, deterioration of current capability due to parasitic capacitance can be compensated for.

Method of Using the Semiconductor Device

An address for specifying a defective sector region may be stored in the nonvolatile register 410. In other words, this semiconductor device is capable of functioning as a circuit which outputs a signal instructing whether or not to shift from a defective memory region (defective sector region, for example) of the memory cell array to a redundant memory region.

Figure 6:
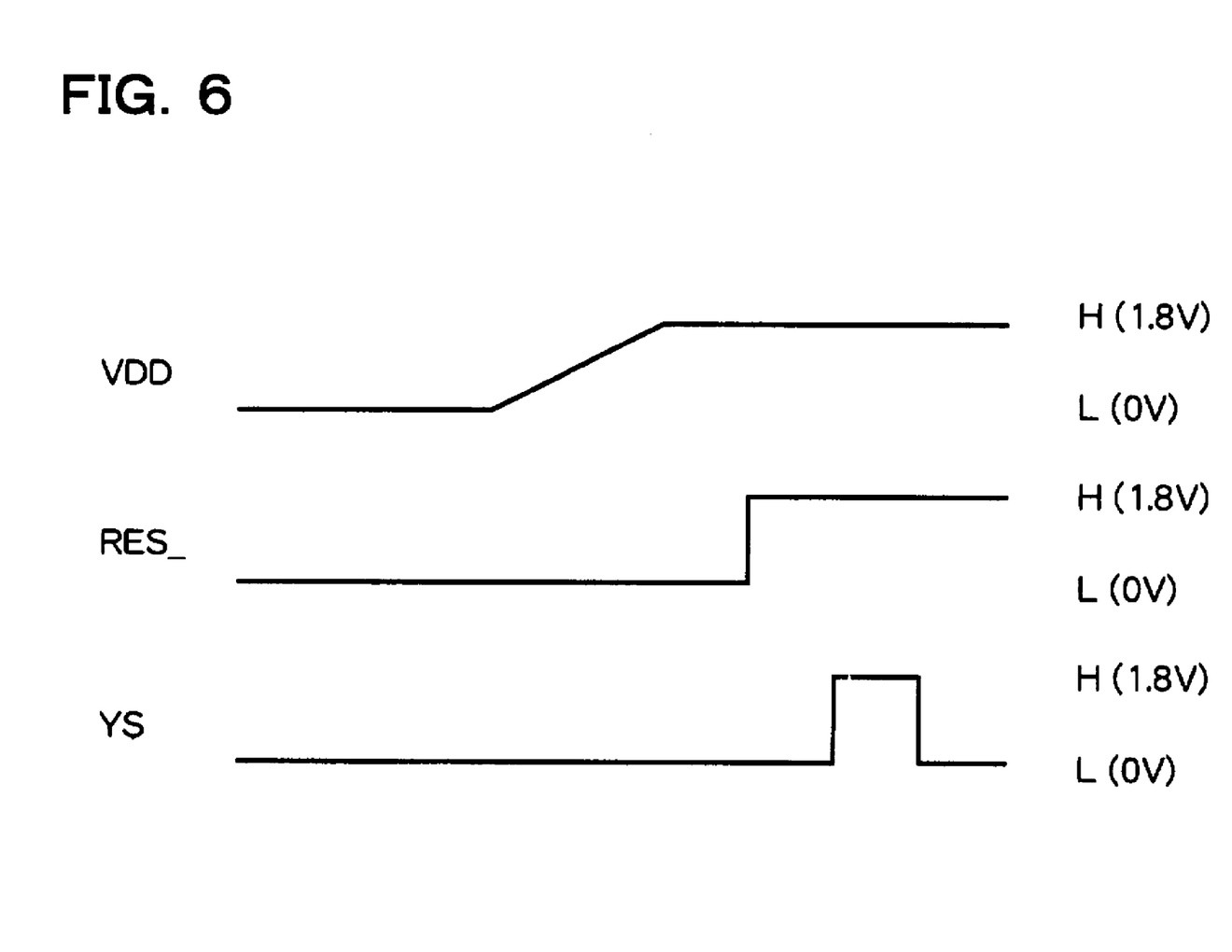
FIG. 6 is a timing chart of operations of the data holding circuit.

An example of a method of reading data from the nonvolatile register 410 to the latch circuit 422 is described below with reference to FIGS. 5 and 6. This example is described taking the time of turning the power on as an example.

The power supply voltage VDD is set at H. Since a reset signal RES is at L when the power supply voltage VDD becomes H, a pch transistor 424 is turned on. Therefore, IBL is at H and LAT is at L. The reset signal RES is set at H, whereby the pch transistor 424 is turned off. After the pch transistor 424 is turned off, a one-shot pulse is input to a select signal YS, whereby an nch transistor 426 is turned on. Data read from the nonvolatile register 410 is input to a flip-flop circuit 422 in a period in which the nch transistor 426 is turned on. Since the nch transistor 426 is provided, the flip-flop circuit 422 can be connected with the nonvolatile register 410 only when it is desired to read data. In other words, it is unnecessary to drive the nonvolatile register 410 after reading data from the nonvolatile register 410 to the flip-flop circuit 422 by driving the nonvolatile register 410. This enables power consumption to be reduced.

The judging circuit 430 judges whether or not the data read from the latch circuit 422 coincides with an address signal of a certain memory region. If the data read from the latch circuit 422 coincides with the address signal of a certain memory region, a signal indicating the coincidence is output from the judging circuit 430 and input to a logic circuit (not shown), whereby a signal instructing replacement of a certain memory region with a redundant memory region is output. A buffer 440 may be provided between the latch circuit 422 and the judging circuit 430.

The above semiconductor device does not need a step of replacing a defective sector region with a redundant sector region. Therefore, a period of time required for a repair step can be reduced.

A configuration example of a memory device having a redundant sector region in the case of storing an address of a defective sector region in the above nonvolatile register is described below.

Figures 7A, 7B:
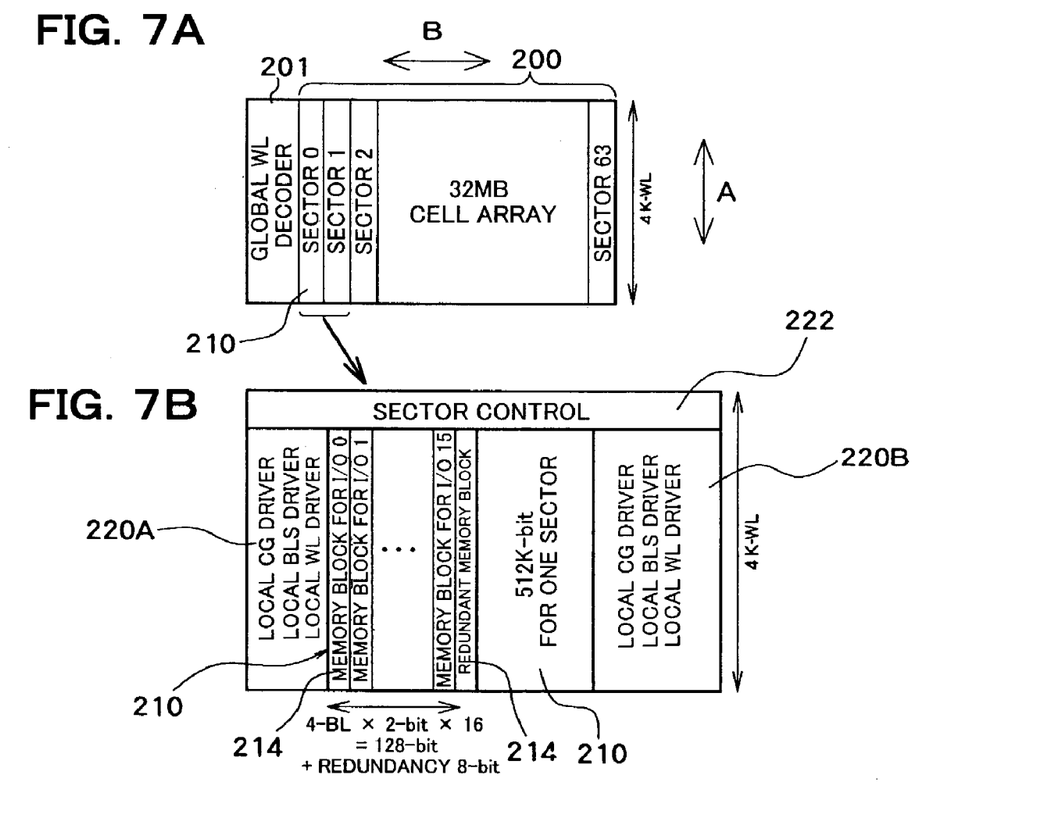
FIG. 7A is a plan layout view of a memory device having one chip of memory cell array.
FIG. 7B shows details of two adjacent 0th and first sector regions of the memory device.

FIG. 7A is a view showing a planar layout of a memory device having one chip of memory cell array. The memory device includes a memory cell array 200 and a global word line decoder 201. The memory cell array 200 has 0th to 63rd sector regions 210 (64 sector regions in total), for example. FIG. 7A shows an example in which the number N of sectors is 64. Memory elements of the memory cell array 200 may be formed by the memory cells of the nonvolatile register.

As shown in FIG. 7A, the 64 sector regions 210 are formed by dividing the memory cell array 200 in the row direction B. Each sector region 210 has a rectangular shape in which the column direction A is the longitudinal direction. The sector region 210 is a minimum unit of data erasure. Data stored in the sector region 210 is erased either collectively or by time division.

The memory cell array 200 has 4K word lines WL and 4K bit lines BL, for example. In the present embodiment, since two nonvolatile memory elements 108A and 108B are connected with one bit line BL, 4K bit lines BL mean a storage capacity of 8K bits. The storage capacity of each sector region 210 is 1/64 of the storage capacity of the entire memory. Each sector region 210 has a storage capacity defined by (4K word lines WL) × (64 bit lines BL)×2.

FIG. 7B shows details of two adjacent 0th and first sector regions 210 of the memory device shown in FIG. 7A. As shown in FIG. 7B, local driver regions (including local control gate driver, local bit line select driver, and local word line driver) 220A and 220B are disposed on opposite sides of the two sector regions 210. A sector control circuit 222 is disposed on the upper sides of the two sector regions 210 and the local driver regions 220A and 220B, for example.

Each sector region 210 has 17 first memory blocks 214 (example in which n is 17) divided in the row direction B. The 16 first memory blocks 214 are normal memory blocks disposed corresponding to 16 (n−1=16) pieces of I/O0 to I/O15 so that 16-bit data can be read out or written in at the same time. The remaining one first memory block 214 is a redundant memory block. When a defective cell is found in one of the 16 normal memory blocks 214, the redundant memory block 214 is used in place of the normal memory block 214 including the defective cell. The number of bits (n−1) may be set to one byte (8 bits), one long word (32 bits), or the like. As shown in FIG. 7B, each of the first memory blocks 214 has 4K (4096) word lines WL.

In the case where the number of sector regions is 64, six higher order bits of the address are stored in the nonvolatile register. Data which specifies a defective I/O may be stored in another memory region.

In the case where the memory elements of the memory cell array 200 are formed by the memory cells of the nonvolatile register, the memory elements of the memory cell array 200 can be driven by the potential setting shown in Table 2.

TABLE 2

| | | Selected block | | | | |
|---|---|---|---|---|---|---|
| | | | Selected MONOS cell | | | |
| | | | | Selected cell | | Opposite cell |
| Mode | BS | WL | SL | CG | BL | CG |
| Read | 4.5 V (opposite side) Vdd (selected side) | Vdd | 0 V | 1.5 V | Sense | 3 V |

As shown in Tables 1 and 2, the potentials at each point of the nonvolatile register when reading data are the same as a part of the potentials at each point of the memory cell array. Therefore, the voltage for driving the memory cell array 200 may be utilized as the voltage for driving the nonvolatile register. In other words, a voltage generating circuit which generates the drive voltage for driving the memory cell array may be used as a circuit which generates the voltage supplied to the nonvolatile register. As a result, since it is unnecessary to separately form a circuit which generates the voltage supplied to the nonvolatile register, the size of the semiconductor chip can be decreased.

The present invention is not limited to the above-described embodiments. Various modifications and variations are possible within the spirit and scope of the present invention. For example, information on an output voltage of a charge pump may be stored in the nonvolatile register.

The above embodiment illustrates an example of reading data in the reverse mode. However, data may be read in the forward mode.

Data may be stored in both memory elements of the memory cell. The data holding circuit 420 may not be formed in the semiconductor device 400.

Detailed description of program operations and erase operations of the memory cell of the nonvolatile register is omitted. If necessary, the program operations and erase operations may be found in detail in U.S. patent application Ser. No. 09/955,160 applied for by the applicant of the present invention.

What is claimed is:

1. A nonvolatile register comprising at least one memory cell, the at least one memory cell comprising:
   one word gate, and
   first and second nonvolatile memory elements controlled by first and second control gates, respectively,
   wherein data is stored in one of the first and second nonvolatile memory elements, and
   wherein the other of the first and second nonvolatile memory elements does not function as an element which stores data,
   the nonvolatile register further comprising a driver circuit which generates a drive voltage for driving the word gate and the first and second control gates,
   wherein the driver circuit generates the drive voltage equal to or lower than a power supply voltage in a data read mode.

2. The nonvolatile register as defined in claim 1,
   wherein one of the first and second nonvolatile memory elements of one memory cell is designated as a selected cell and the other is designated as a nonselected opposite cell, and a voltage equal to or lower than a power supply voltage is supplied to both the selected cell and the nonselected opposite cell, in a data read mode.

3. The nonvolatile register as defined in claim 2,
   wherein a voltage applied to one of the first and second control gates corresponding to the nonselected opposite cell when reading data from the selected cell is set to be higher than a threshold voltage in a state in which charges are not stored in the nonselected opposite cell.

4. The nonvolatile register as defined in claim 3,
   wherein a select voltage is supplied to both the selected cell and the nonselected opposite cell when reading data from the selected cell.

5. The nonvolatile register as defined in claim 1, further comprising a plurality of bit lines,
   wherein a plurality of the memory cells are arranged along a row direction and a column direction and the bit lines are provided along the column direction, and
   wherein each of a plurality of the bit lines is connected in common with the adjacent first and second nonvolatile memory elements in two memory cells adjacent in the row direction in each row.

6. The nonvolatile register as defined in claim 5,
   wherein the same data is stored in the first nonvolatile memory element in one of the two adjacent memory cells and the second nonvolatile memory element in the other of the two adjacent memory cells.

7. The nonvolatile register as defined in claim 6,
   wherein each of the bit lines connected in common with the two adjacent memory cells functions as a drain line.

8. The nonvolatile register as defined in claim 1,
   wherein a plurality of dummy memory cells are provided around the nonvolatile register, and
   wherein each of the dummy memory cells includes the word gate and at least one of the first and second nonvolatile memory elements of the memory cell.

9. The nonvolatile register as defined in claim 1,
   wherein each of the first and second nonvolatile memory elements includes an ONO film formed of an oxide film (O), a nitride film (N), and an oxide film (O) as a charge trap site.

10. A semiconductor device comprising:
    the nonvolatile register as defined in claim 1;
    a data holding circuit for holding data read from the nonvolatile register; and
    a judging circuit for judging whether or not the data read from the data holding circuit coincides with a signal to be judged.

11. The semiconductor device as defined in claim 10,
    wherein a switching element is provided between the nonvolatile register and the data holding circuit, and
    wherein connection or disconnection between the nonvolatile register and the data holding circuit is selected by the switching element.

12. The semiconductor device as defined in claim 10,
    wherein the semiconductor device includes a memory cell array region having a plurality of sector regions and a redundant sector region, and
    wherein address information of one of the sector regions to be switched to the redundant sector region is stored in the nonvolatile register.

13. The semiconductor device as defined in claim 12,
    wherein the memory cell array region is formed of the same memory cell as the memory cell of the nonvolatile register.

14. The semiconductor device as defined in claim 12, further comprising a voltage generating circuit which generates a drive voltage for driving the memory cell array,
    wherein the voltage generating circuit is used as a circuit which generates a voltage supplied to the nonvolatile register.

15. A semiconductor device comprising:
    the nonvolatile register as defined in claim 1; and
    a judging circuit for judging whether or not data read from the nonvolatile register coincides with a signal to be judged.

* * * * *